United States Patent
Chow et al.

(10) Patent No.: US 7,966,429 B2
(45) Date of Patent: *Jun. 21, 2011

(54) PERIPHERAL DEVICES USING PHASE-CHANGE MEMORY

(75) Inventors: David Q. Chow, San Jose, CA (US);
Charles C. Lee, Cupertino, CA (US);
Frank I-Kang Yu, Palo Alto, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 1058 days.

This patent is subject to a terminal disclaimer.

(21) Appl. No.: 11/754,332

(22) Filed: May 28, 2007

(65) Prior Publication Data
US 2008/0298120 A1   Dec. 4, 2008

(51) Int. Cl.
G06F 13/28 (2006.01)
G06F 3/00 (2006.01)
G06F 15/167 (2006.01)
G06F 12/00 (2006.01)
G06F 13/00 (2006.01)

(52) U.S. Cl. ............... 710/22; 709/212; 710/5; 711/101

(58) Field of Classification Search .................... 710/22, 710/5; 709/212; 711/101
See application file for complete search history.

(56) References Cited

U.S. PATENT DOCUMENTS

| | | | |
|---|---|---|---|
| 5,265,220 A * | 11/1993 | Kinoshita | ................. 711/205 |
| 5,933,365 A | 8/1999 | Klersy et al. | |
| 6,512,241 B1 | 1/2003 | Lai | |
| 6,545,907 B1 * | 4/2003 | Lowrey et al. | ................. 365/163 |
| 6,869,883 B2 | 3/2005 | Chiang et al. | |
| 7,026,639 B2 | 4/2006 | Cho et al. | |
| 7,078,273 B2 | 7/2006 | Matsuoka et al. | |
| 7,103,718 B2 | 9/2006 | Nickel et al. | |
| 2003/0223285 A1 | 12/2003 | Khouri et al. | |
| 2004/0228163 A1 | 11/2004 | Khouri et al. | |
| 2004/0248339 A1 | 12/2004 | Lung | |
| 2004/0256610 A1 | 12/2004 | Lung | |
| 2005/0185572 A1 * | 8/2005 | Resta et al. | ................. 370/205 |
| 2006/0018183 A1 | 1/2006 | De Sandre et al. | |
| 2006/0097239 A1 | 5/2006 | Hsiung | |
| 2006/0126381 A1 | 6/2006 | Khouri et al. | |
| 2006/0203542 A1 | 9/2006 | Kurotsuchi et al. | |
| 2006/0274574 A1 | 12/2006 | Choi et al. | |

* cited by examiner

Primary Examiner — Alford W Kindred
Assistant Examiner — Farley Abad
(74) Attorney, Agent, or Firm — Stuart T. Auvinen; gPatent LLC

(57) ABSTRACT

Peripheral devices store data in non-volatile phase-change memory (PCM). PCM cells have alloy resistors with high-resistance amorphous states and low-resistance crystalline states. The peripheral device can be a Serial AT-Attachment (SATA) or integrated device electronics (IDE) PCM solid-state disk or a Multi-Media Card/Secure Digital (MMC/SD) card. A peripheral PCM controller accesses PCM mass storage devices containing PCM memory chips that form a mass-storage device that is block-addressable rather than randomly-addressable. SATA, IDE, or MMC/SD transactions from a host bus are read by a bus transceiver on the peripheral PCM controller. Various routines that execute on a CPU in the peripheral PCM controller are activated in response to commands in the host-bus transactions. A PCM controller in the peripheral controller transfers data from the bus transceiver to the PCM mass storage devices for storage.

18 Claims, 10 Drawing Sheets

PERIPHERAL DEVICES USING PHASE-CHANGE MEMORY

FIELD OF THE INVENTION

This invention relates to peripheral storage devices, and more particularly to peripherals using phase-change memories (PCM).

BACKGROUND OF THE INVENTION

One factor behind the widespread acceptance and commercial success of personal computers (PC's) is expandability. Early PC's allowed expansion devices on AT cards to be plugged into an AT expansion bus inside the PC. Extra memory, disk drives, modems, network controllers, and a wide variety of creative devices could be added to the PC using such AT cards.

More recently updated expansion buses and ports have been incorporated into PCs. Hard disks may be attached to the PC using an integrated device electronics (IDE), Serial AT-Attachment (SATA), or a PCI-Express (PCIe) interface bus. Flash-memory devices the size of a pack of chewing gum or hidden inside an ink pen may be plugged into a Universal-Serial-Bus (USB) connector on the PC. Flash-memory cards that also fit inside digital cameras or music players can be plugged into a Multi-Media Card/Secure Digital (MMC/SD), Compact Flash (CF), Memory Stick (MS), or other flash-card reader slot to be read by the PC.

Many peripheral devices today use flash memory. Flash memory contains electrically-erasable programmable read-only memory (EEPROM) that is non-volatile. However, erase consumes a large amount of time, especially when compared to fast read times. Some flash memories may contain restrictions on the number of time data may be written between erase cycles, and other restrictions. The slow erase time and other restrictions limit the usefulness of flash memory peripherals.

What is desired is a peripheral device that uses non-volatile memory other than flash memory. A peripheral device for use with PC's and other systems is desirable that uses non-volatile memory with a faster write/erase time that is closer to the read time.

DETAILED DESCRIPTION

The present invention relates to an improvement in peripherals. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Phase-Change Memory—FIGS. 1-4

Figure 1:
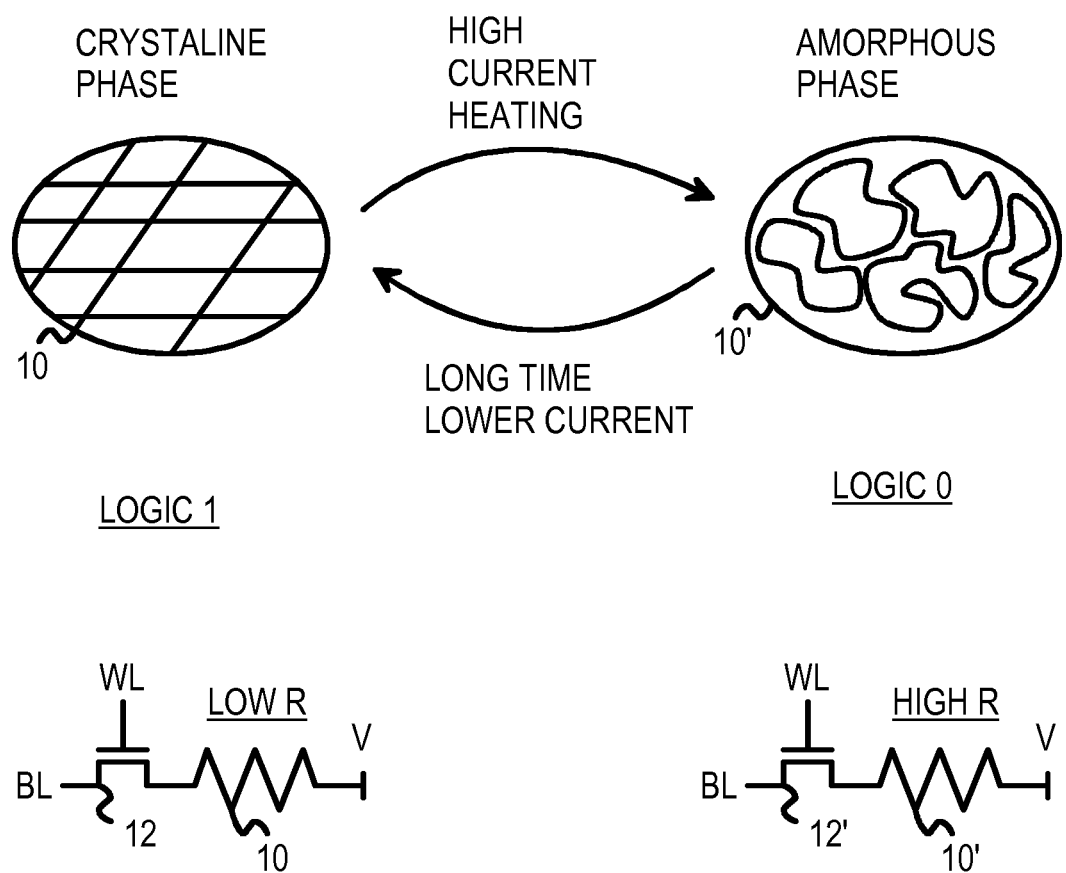
FIG. 1 shows a phase-change memory cell.

FIG. 1 shows a phase-change memory cell. Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

In FIG. 1, when alloy resistor 10 is in the crystalline state, its resistivity is low. The crystalline state represents a logic high or 1. A PCM memory cell has alloy resistor 10 in series with select transistor 12 between a bit line BL and a voltage V. When V is a low voltage such as ground, and word line WL is driven high, the bit-line voltage is pulled from a high pre-charged state to ground through select transistor 12 and alloy resistor 10 due to the low resistance of alloy resistor 10.

When alloy resistor 10' is in the amorphous state, its resistivity is high. The amorphous state represents a logic low or 0. Another PCM memory cell has alloy resistor 10' in series with select transistor 12' between a bit line BL and a voltage V. When V is a low voltage such as ground, and word line WL is driven high, the bit-line voltage remains in its high or pre-charged state, since the high resistance of alloy resistor 10' limits current through select transistor 12'.

Note that the assignment of logical 0 and logic 1 states to the crystalline and amorphous states is arbitrary. The crystalline state could be assigned logical 1 or logical 0, with the amorphous state having the opposite logical value.

Alloy resistor 10 may be a small layer that is integrated with select transistor 12, such as a layer over or near the source terminal of transistor 12. Alternately, alloy resistor 10 may be a separate resistor device, such as a patterned line or snaking line between the source of select transistor 12 and ground.

When a high current is passed through alloy resistor 10, the alloy can transform from the crystalline state into the amorphous state. The high current creates resistive heating in alloy resistor 10 and the melting temperature is rapidly reached, causing the crystal to melt into a liquid. Upon rapid cooling, alloy resistor 10 solidifies into the amorphous state since there is little time for crystals to grow during cooling.

When a lower current is passed through alloy resistor 10 for a long period of time, the crystalline temperature is reached or exceeded. However, the current is not sufficient to cause the higher melting temperature to be reached. The amorphous alloy begins to crystallize over this long time period. For example, small crystal domains within the amorphous state may grow and absorb other domains until alloy resistor 10 contains one or just a few crystal domains.

Thus alloy resistor 10' transforms from the high-resistance amorphous state into the low-resistance crystalline state by applying a moderate current for a relatively long period of time, allowing the crystal to grow at the crystalline temperature. Alloy resistor 10 transforms from the low-resistance crystalline state into the high-resistance amorphous state by applying a high current for a relatively short period of time, allowing the crystal to melt into an amorphous blob at the melting temperature. The shape of this amorphous blob may be limited or contained by surrounding oxide or other insulating layers.

Figure 2:
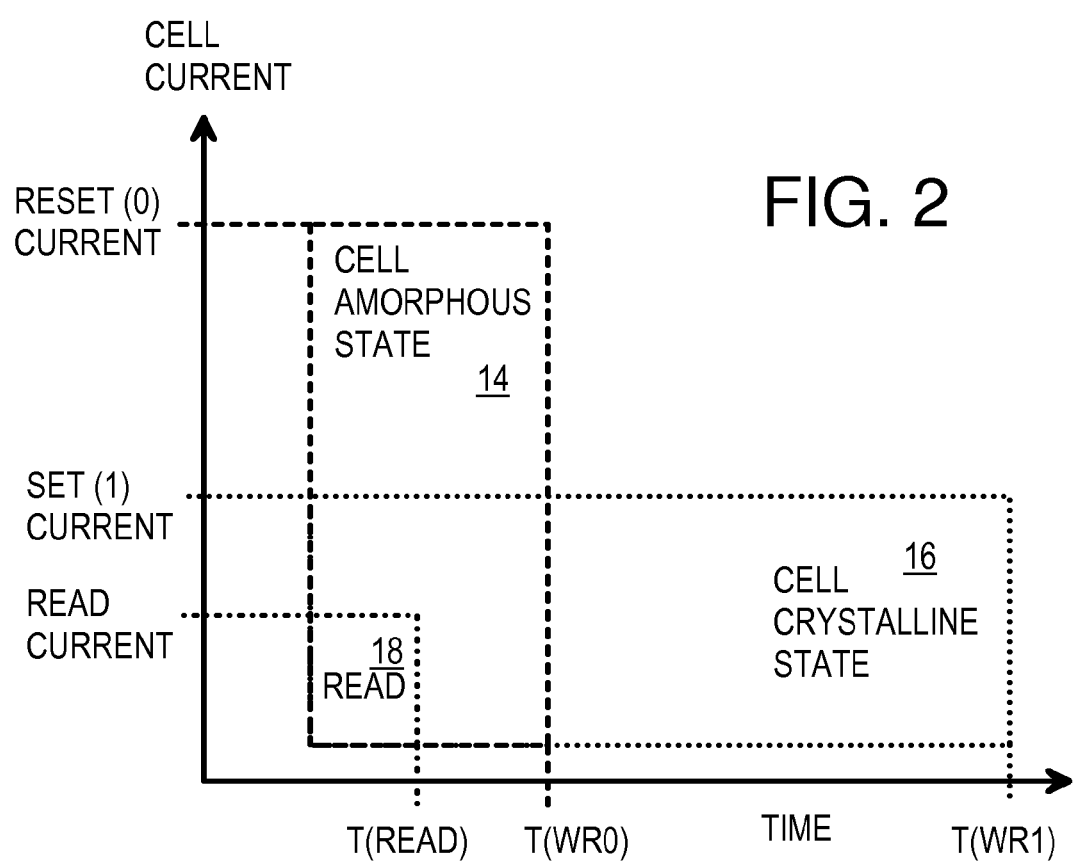
FIG. 2 is a graph of current and time to transform states in a phase-change memory cell.

FIG. 2 is a graph of current and time to transform states in a phase-change memory cell. Amorphous state 14 is reached when a high current (the reset current) is applied for a time of T(WR0). Crystalline state 16 is reached when a moderate current, the set current, is applied for a longer period of time T(WR1). These states are retained when currents below the moderate current are applied, or when currents are applied for short periods of time. State transformations, or partial state transformations, may occur when the full currents and times are not both met, such as applying the set current for less than the set time. These partial state transformations are undesirable.

The PCM cell can safely be read by applying a lower read current for a short period of time. For example, the read current can be less than either the set or reset currents. Reading 18 has the read current applied for less than the set or reset times, T(WR1), T(WR0), respectively. For example, the read time T(READ) can be less than half of the reset time, and the read current can be less than half of the set current. The reset current can be double or more the set current, and the set time can be double, triple, 5×, or more of the reset time.

Figure 3:
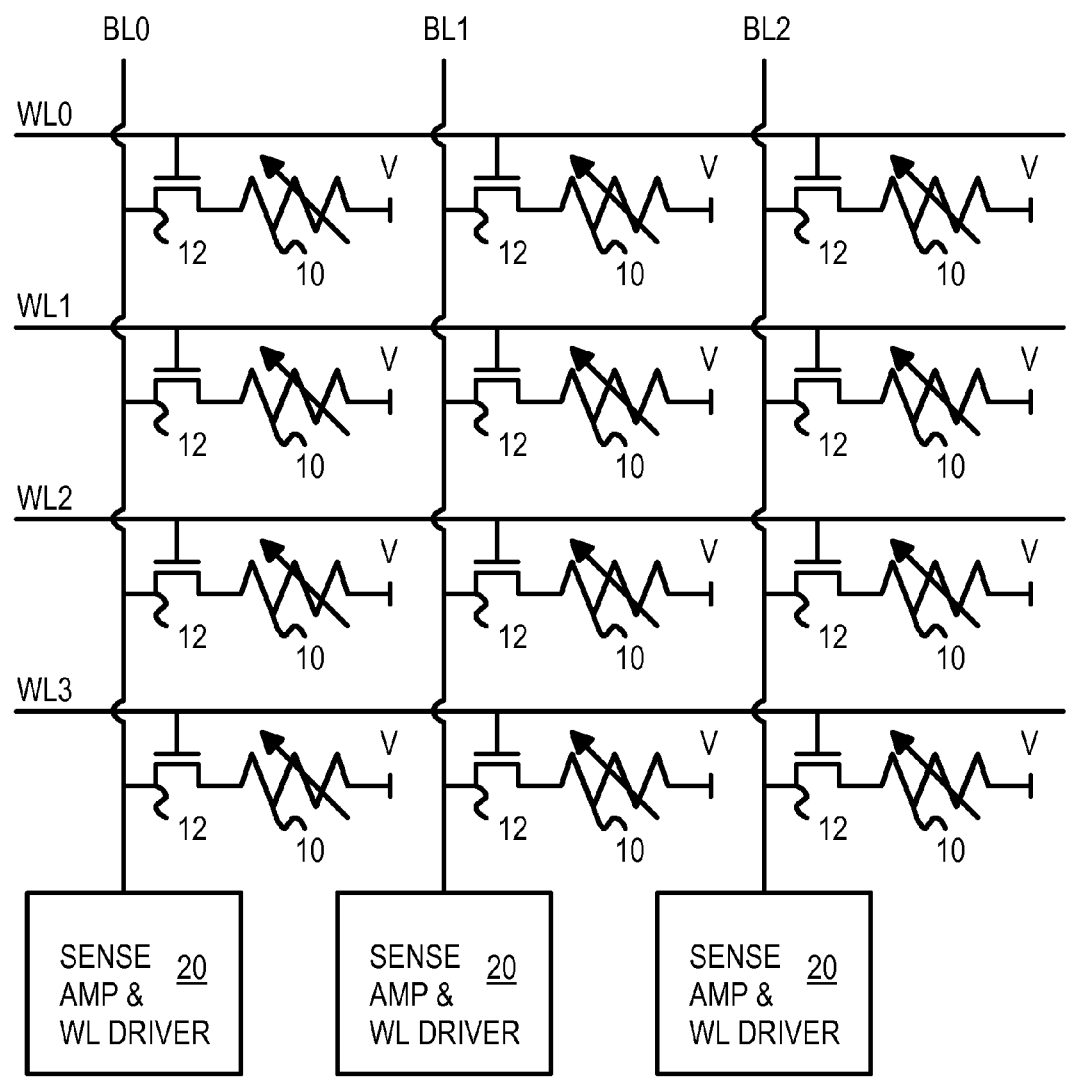
FIG. 3 shows an array of phase-change memory cells.

FIG. 3 shows an array of phase-change memory cells. Word lines WL0:3 are applied to the gates of select transistors 12, while bit lines BL0:2 connect to the drains of select transistors 12. Alloy resistors 10 are in series between the sources of select transistors 12 and a cell voltage V, which could be ground, power, or some other voltage, and could be switched on and off, such as for power down or to disable an array or block.

Alloy resistors 10 each can be in a high-resistance amorphous state, or in a low-resistance crystalline state. The current drawn from a bit line by select transistor 12 and alloy resistor 10 in the selected word line (row) is sensed by sense amplifiers 20 and amplified and buffered to generate the data read from the cell. The current drawn through alloy resistor 10 is less than or equal to the read current.

During writing, sense amplifiers 20 activate bit-line drivers that drive the set or reset current onto the bit lines and through the selected alloy resistor. After the current is applied for the set or reset time, alloy resistor 10 is transformed into the new state, either the amorphous or crystalline state. One cell per column is written, since only one of the word lines is activated at a time. Columns being written into the 0 state have the reset current applied to the bit line for the reset time period, while columns being written into the 1 state have the set current applied for the set time period.

Figure 4:
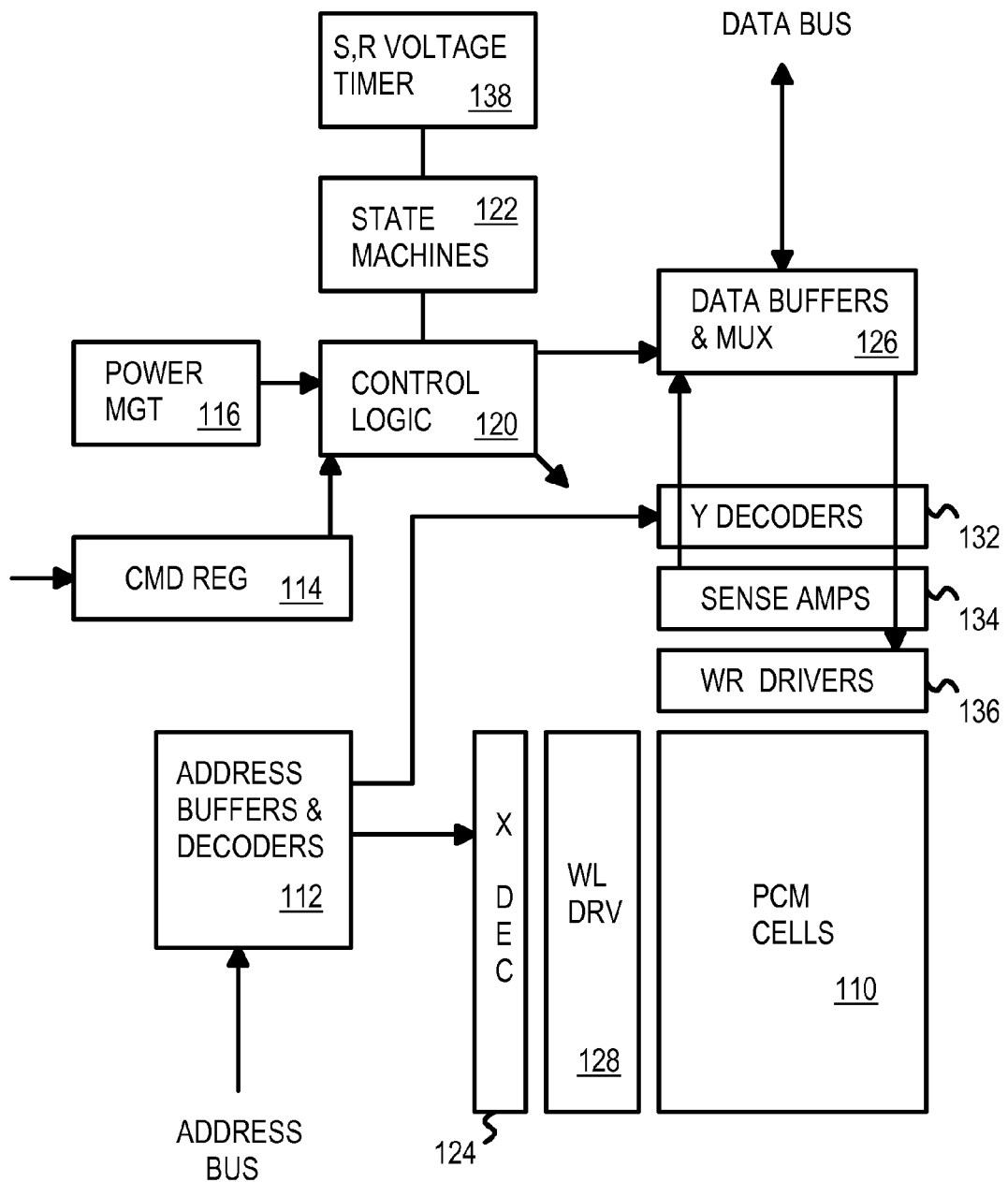
FIG. 4 shows a phase-change memory.

FIG. 4 shows a phase-change memory. A PCM chip may include some or all of the blocks shown in FIG. 4, and other blocks, or some of the functions may be performed by a separate PCM controller.

PCM cells 110 is an array of rows and columns of select transistors and alloy resistors that change between crystalline and amorphous phase states. The high and low resistance values of the 2 phase states are sensed by sense amplifiers 134 when a read current is drawn through a selected row of PCM cells. Word line drivers 128 drives one row or word line in PCM cells 110 while the other rows are disabled. A row portion of an address applied to address decoder 112 is further decoded by X decoder 124 to select which row to activate using word line drivers 128.

A column portion of the address applied to address decoder 112 is further decoded by Y decoder 132 to select a group of bit lines for data access. Data buffers 126 may be a limited width, such as 64 bits, while PCM cells may have a larger number of bit lines, such as 8×64 columns. One of the 8 columns may be selected by Y decoder 132 for connection to data buffers 126.

During writing, external data is collected by data buffers 126 and applied to write drivers 136. Write drivers 136 generate voltages or currents so that the set currents are applied to bit lines for PCM cells that are to be written with a 1, while higher reset currents are applied to bit lines for PCM cells to be reset to 0.

Set, reset voltage timer 138 includes timers that ensure that the set currents are applied by write drivers 136 for the longer set period of time, while the reset currents are applied for the shorter reset time period, and write drivers 136 for reset PCM cells are disabled after the reset time period.

State machines 122 can activate set, reset voltage timers 138 and cause control logic 120 to disable write drivers 136 after the set and reset time periods have expired. State machines 122 can generate various internal control signals at appropriate times, such as strobes to pre-charge bit lines and latch sensed data into data buffers 126.

Command register 114 can receive commands that are decoded and processed by control logic 120. External control signals such as read/write, data strobes, and byte enables may also be received in some embodiments. Command register 114 may be replaced by a command decoder in some embodiments. Power management unit 116 can power down blocks to reduce power consumption, such as when the PCM chip is de-selected. Since PCM cells 110 are non-volatile, data is retained when power is disconnected.

There may be several arrays of PCM cells 110 and associated logic on a large PCM chip. An array-select portion of the address can be decoded by address decoders 112 to enable one of the many arrays or blocks on the PCM chip.

Figure 5:
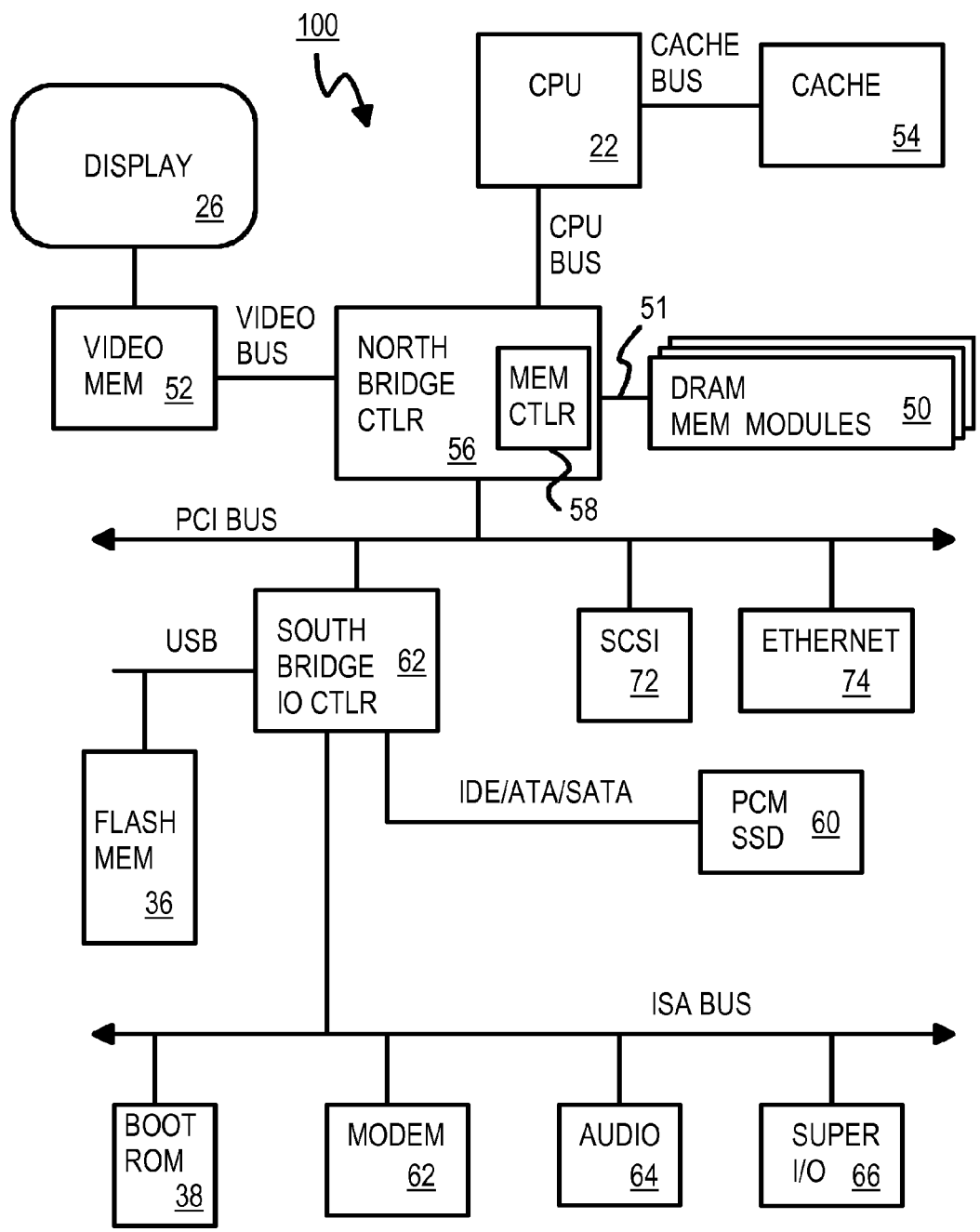
FIG. 5 shows a PC motherboard using phase-change memory.

FIG. 5 shows a PC motherboard using phase-change memory. Motherboard 100 can be a main printed-circuit board (PCB) of a personal computer, although some components may be on daughter or add-on cards. For example, DRAM memory modules 50 can be on small memory module cards that fit into memory module sockets on motherboard 100, while flash memory 36 may be a small portable device that fits into a USB receptacle. Modem 62 could be on motherboard 100 or on an add-on ISA or AT card, as could other components.

CPU 22 stores copies of data and instructions in cache 54. When cache 54 is integrated with CPU 22, cache 24 may be SRAM, depending on the microprocessor manufacturer.

North bridge controller 56 is a chip or chip set that connects the various local buses together, such as the CPU bus from CPU 22, a video bus to video memory 52, and memory bus 51 to DRAM memory modules 50. DRAM memory controller 58 in north bridge controller 56 can generate the timings and control voltages for access of memory cells in DRAM memory modules 50, or these functions may be integrated onto chips on DRAM memory modules 50. DRAM memory controller 58 could also be placed on each DRAM memory modules 50, or the memory controller function could be partitioned between the DRAM memory chips, memory modules, and north bridge controller 56.

North bridge controller 56 may include a direct-memory access (DMA) engine that allows for memory transfers that do not require reads and writes by CPU 22. For example, frame buffer data could be copied from DRAM memory modules 50 directly to video memory 52, or data from peripheral devices such as Ethernet card 74 or SCSI device 72 could be transferred directly to and from DRAM memory modules 50.

North bridge controller 56 connects to Peripheral Component Interconnect (PCI) bus, which has a few higher-performance peripherals such as Ethernet card 74 and small-computer system interface (SCSI) device 72. SCSI device 72 could be a hard disk drive.

South bridge controller 62 connects to the PCI bus and transfers data to slower buses, such as to USB, integrated device electronics (IDE), Serial AT-Attachment (SATA), ATA, or Industry Standard Architecture (ISA) buses. Some devices on these buses may be removable, and some older devices may use flash or DRAM memory. Boot code may be stored in boot ROM 38.

Older and slower peripherals can be placed on the ISA bus and accessed by CPU 22 or DMA through north bridge controller 56 and south bridge controller 62. Modem 62, audio system 64, and super I/O 66 are examples of older peripherals that could be located on separate ISA cards that are removable, or could be integrated onto motherboard 100. An integrated I/O controller chip could include all these functions and be directly soldered onto motherboard 100.

Rather than use older flash memory, some peripherals may use phase-change memory. For example, PCM solid-state disk 60 may be a mass storage, block-addressable device that uses phase-change memory rather than flash memory or a rotating hard disk.

Figure 6:
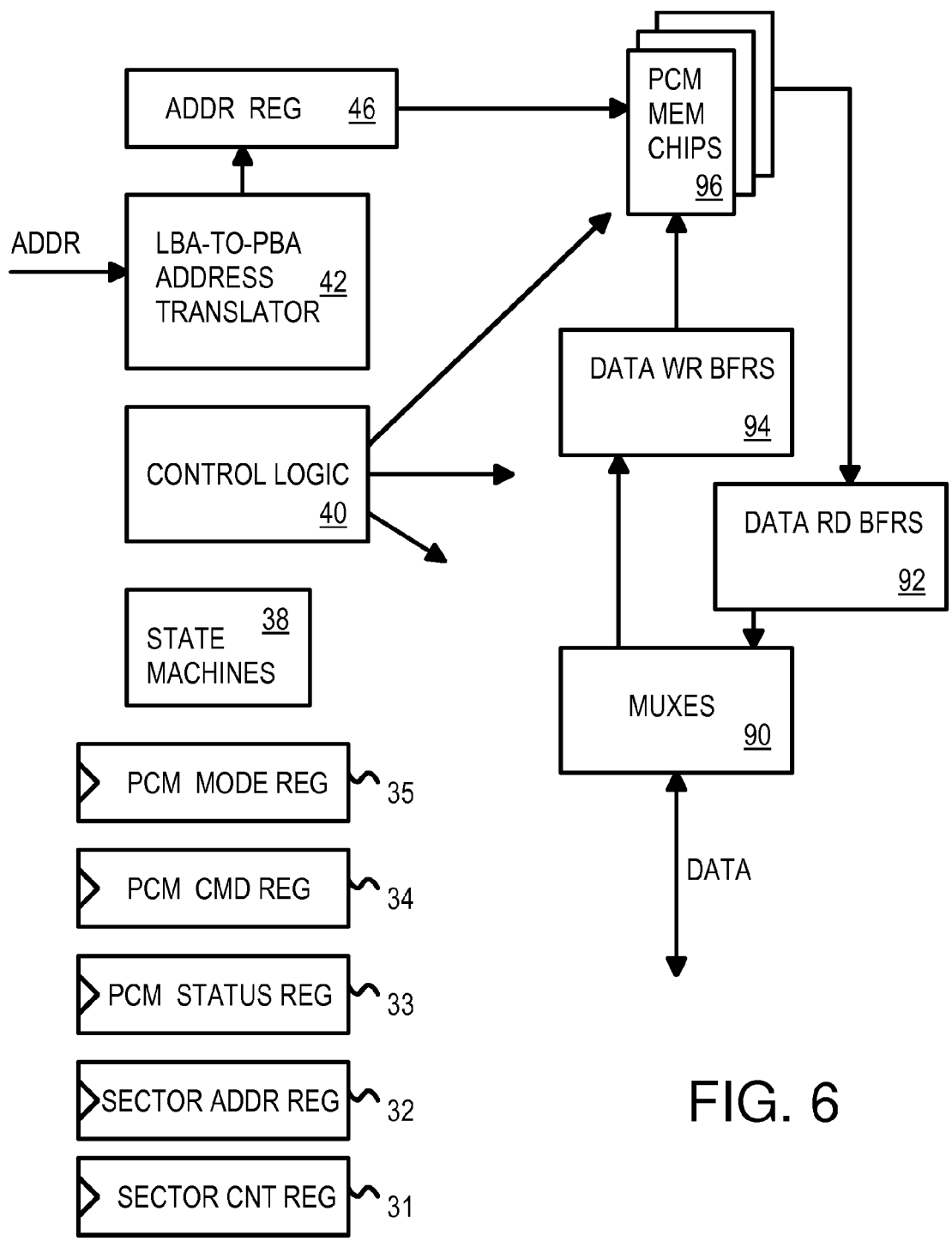
FIG. 6 shows a phase-change memory mass-storage device.

FIG. 6 shows a phase-change memory mass-storage device. Rather than store data in flash memory, a PCM peripheral can store data in a PCM mass-storage device built around phase-change memory chips 96. Although phase-change memory chips 96 are randomly-addressable, a block-addressable interface is provided by the PCM mass storage device.

Phase-change memory chips 96 can include one or more phase-change memory chips such as the chip shown in FIGS. 3-4. Data is read from phase-change memory chips 96 in response to a physical address in address register 46, which activates a word line (row) and selects a column of bits lines for sensing and output. The data read from phase-change memory chips 96 is stored in read buffers 92 and then output through mux 90 to the data I/O of the PCM mass storage device.

During a write operation, data input to the PCM mass-storage device is sent through mux 90 and stored in write buffers 94 before being written into a location of PCM memory cells selected by the address in address register 46. The long set pulse and the shorter reset pulses are generated and applied to bit lines to set and reset the PCM cells, causing the alloy resistors in the cells to melt into the amorphous state when the shorter reset pulse is applied, or crystallize into the crystalline state when the longer set pulse is applied.

Addresses that are input to the PCM mass storage device are sector or block addresses that refer to a block of 512 or more bytes of data, rather than to individual bytes or words of 4, 8, or 16 bytes. For example, the peripheral device may generate logical-block address (LBA) or sector addresses rather than physical-block address (PBA).

Block addresses are converted to byte or word addresses by address translator 42. The block address bits may be shifted into the correct positions by address translator 42, or more complex re-mapping may be performed by address translator 42. The translated physical address is latched into address register 46 for decoding to access phase-change memory chips 96.

The PCM peripheral device loads control and address information into registers 25-31 to control operations such as access of phase-change memory chips 96 by control logic 40. Control logic 40 activates state machines 30 to generate timings for signals applied to phase-change memory chips 96, such as data or address strobes or select signals.

Registers 25-31 may be written by the PCM peripheral device through mux 90, or by another path such as a control bus (not shown). Sector address register 32 is written with a sector address that may also be applied to address translator 42, or may be separately maintained. The sector address in register 32 may be incremented as large multi-sector blocks of data are transferred. Sector count register 31 can store a sector counter that indicates the number of sectors remaining to transfer. The sector count in register 31 can be decremented as each sector is accessed, with a zero count indicating the completion of the transfer.

PCM command register 34 is written with a command for control logic 40 to processes, such as to transfer data to registers 25-31, or to begin access of phase-change memory chips 96, or to send back status. A wide variety of commands may be supported. PCM status register 33 is read by the PCM peripheral device to examine the current status of the PCM mass-storage device. Successful transfers can set or reset success flags in PCM status register 33, while failures may set other flags to indicate the problem for diagnostics routines. PCM mode register 35 can set various modes such as for altering power consumption or operational characteristics of phase-change memory chips 96.

Figure 7:
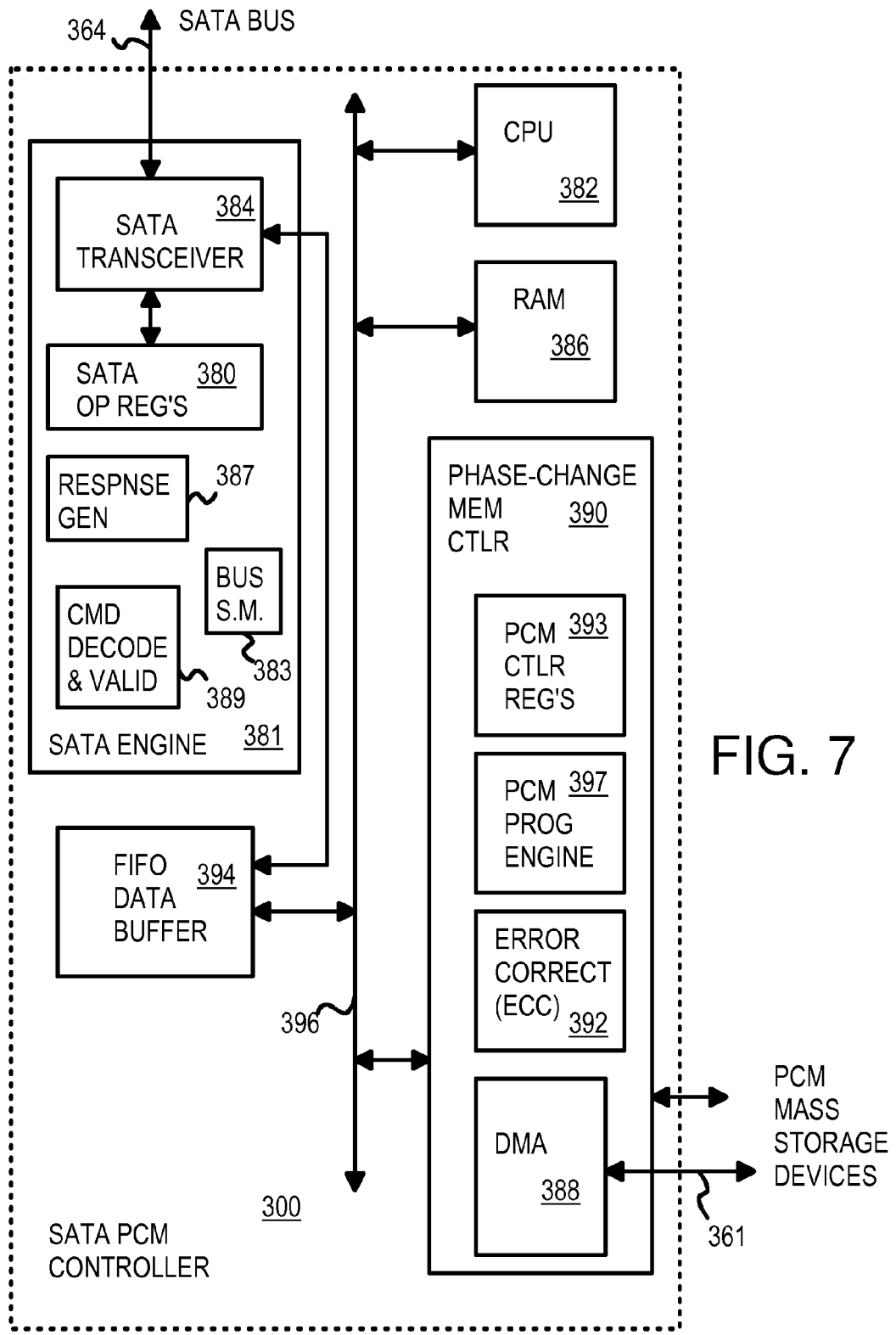
FIG. 7 is a block diagram of a SD controller for a phase-change memory solid state disk (SSD).
Figure 8:
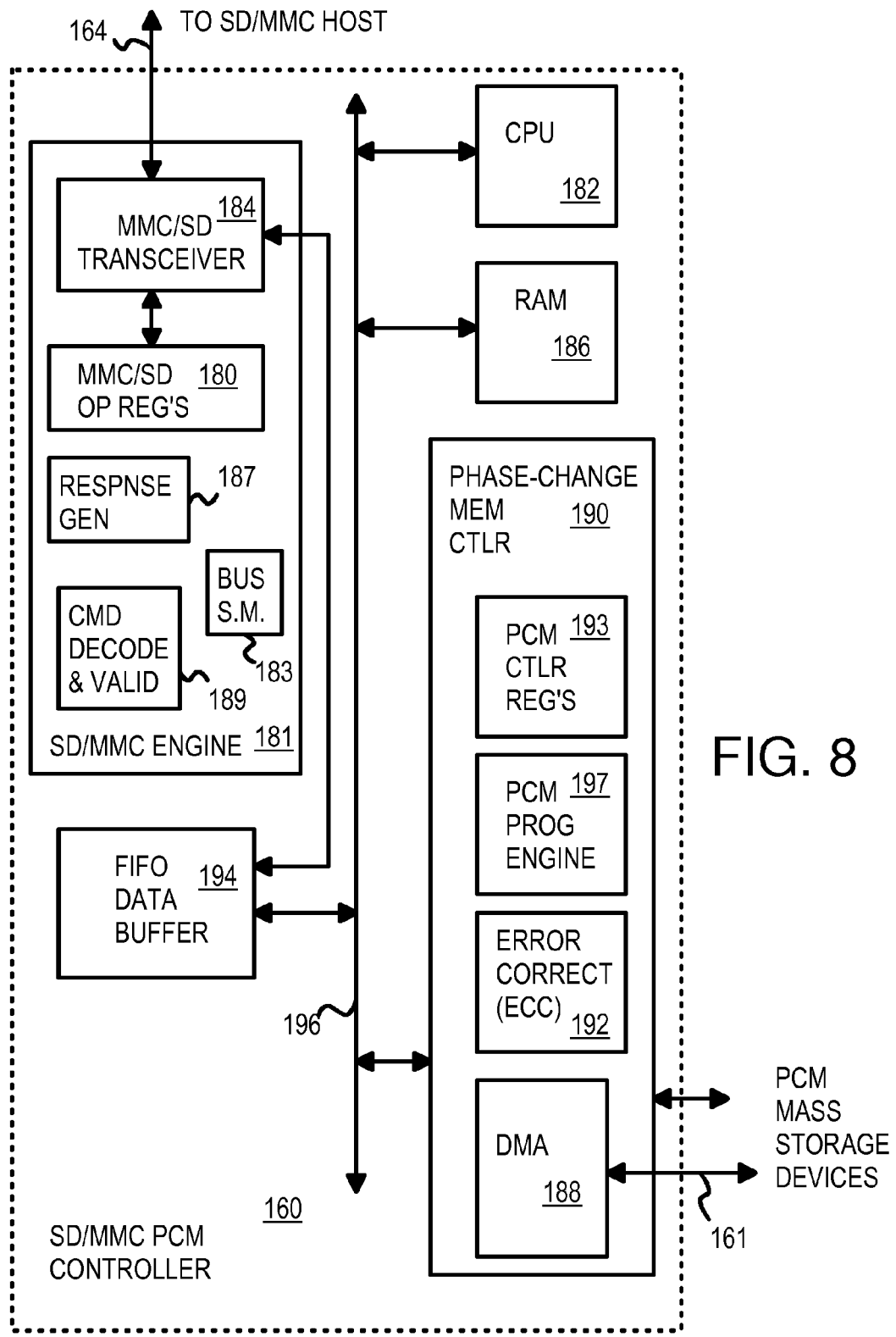
FIG. 8 is a block diagram of a Secure-Digital/Multi-Media Card (SD/MMC) controller for a phase-change memory device.
Figure 9:
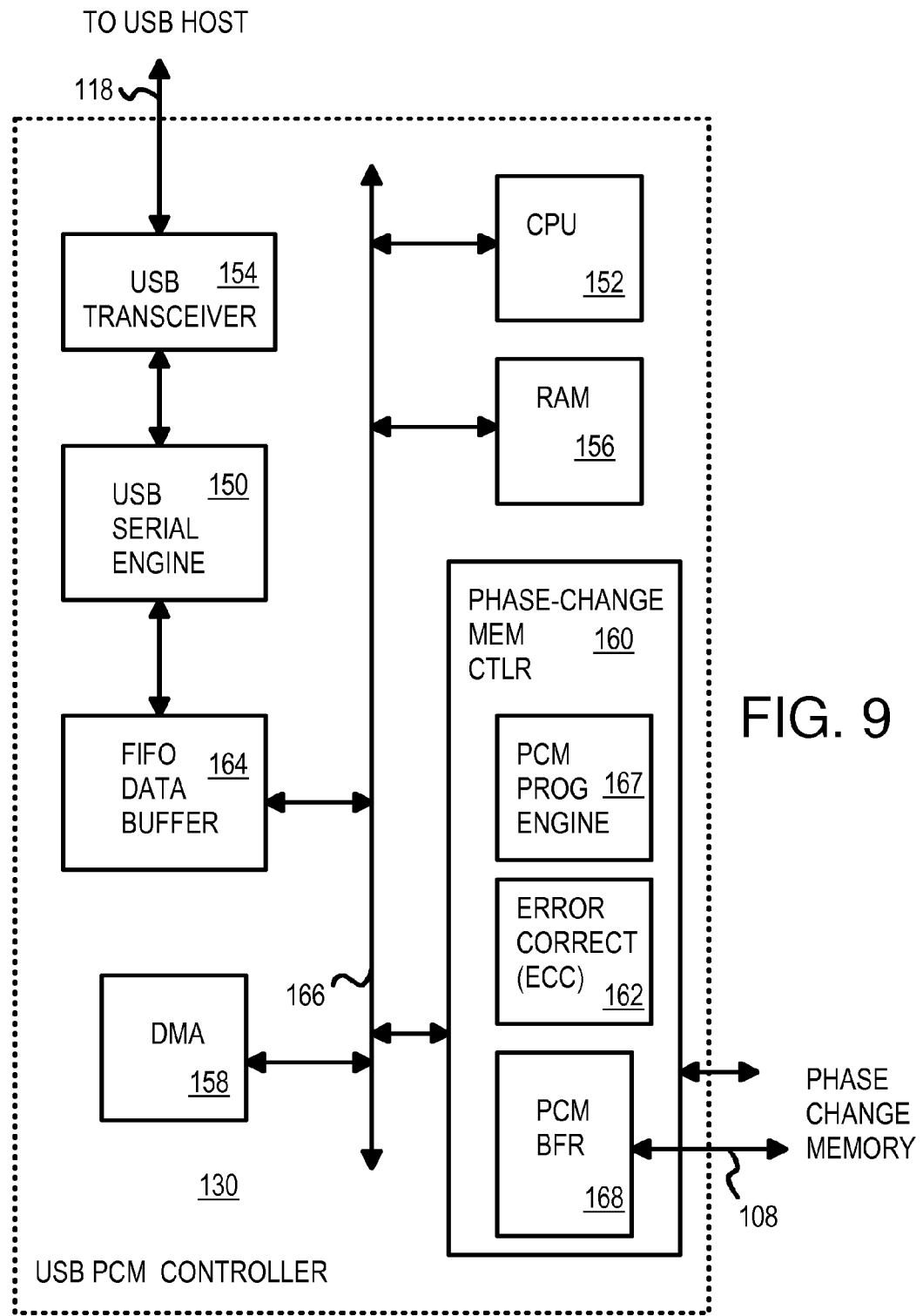
FIG. 9 is a block diagram of a USB phase-change-memory (PCM) controller inside a USB PCM device.

Peripherals Using PCM—FIGS. 7-9

FIG. 7 is a block diagram of a SD controller for a phase-change memory solid state disk (SSD). Rather than use a rotating magnetic hard disk for mass storage, the may use a solid state disk with flash memory replaced with phase-change memory for a PCM SSD. PCM controller 300 and its mass storage devices of phase-change memory chips could replace PCM solid-state disk 60 of FIG. 5.

The solid state disk (SSD) can have an array of PCM memory chips that form one or more PCM mass-storage devices such as shown in FIG. 6. Each of the phase-change memory chips in the PCM mass-storage device can have the structure shown in FIGS. 3-4. These PCM memory chips communicate with single-chip PCM controller 300 over PCM bus 361. DMA engine 388 in PCM controller 390 writes and reads blocks of data in the array of PCM chips for the solid-state storage.

Inside PCM controller 300, SATA engine 381 is an interface to a Serial AT-Attachment (SATA) bus, such as SATA bus 364, which can connect to a south-bridge controller chip, or another bus chip in a host computer. Internal bus 396 connects CPU 382 with RAM 386, FIFO data buffer 394, direct-memory access (DMA) engine 388, and PCM controller 390. CPU 382 executes instructions from RAM 386, while DMA engine 388 can be programmed to transfer data between FIFO data buffer 394 and PCM controller 390. CPU 382 can operate on or modify the data by reading the data over bus 396. RAM 386 can store instructions for execution by the CPU and data operated on by the CPU.

SATA transceiver 384 connects to the clock CLK and parallel data lines of SATA bus 364 and contains both a clocked receiver and a transmitter. An interrupt to CPU 382 can be generated when a new command is detected on SATA bus 334. CPU 382 can then execute a routine to handle the interrupt and process the new command.

SATA operating registers 380 include the protocol registers required by the SATA specification. Registers may include a data-port, write-protect, memory select, memory status, interrupt, and identifier registers. Other extension registers may also be present.

Command decode and validator 389 detects, decodes, and validates commands received over SATA bus 334. Valid commands may alter bus-cycle sequencing by bus state machine 383, and may cause response generator 387 to generate a response, such as an acknowledgement or other reply.

The transmit and receive data from SATA engine 381 is stored in FIFO data buffer 394, perhaps before or after passing through a data-port register in SATA operating registers 380. Commands and addresses from the SATA transactions can also be stored in FIFO data buffer 394, to be read by CPU 382 to determine what operation to perform.

Phase-change-memory PCM controller 390 includes one or more of PCM control registers 393, DMA engine 388, PCM programming engine 397, and error-corrector 392. Data can be arranged to match the bus width of internal bus 396 or PCM bus 361, such as in 32, 64, or 128-bit words. DMA engine 388 can be programmed by CPU 382 to transfer a block of data between PCM bus 361 and FIFO data buffer 394.

PCM control registers 393 may be used in conjunction with DMA engine 388, or may operate independently. PCM-specific registers in PCM control registers 393 may include a data port register, interrupt, command and selection registers, address and block-length registers, and cycle registers. PCM control registers 393 include shadow registers that have a copy of the contents of registers in the PCM mass storage device, such as registers 25-31 of FIG. 6.

Error-corrector 392 can read parity or error-correction code (ECC) from PCM storage chips and perform data corrections. The parity or ECC bits for data that is being written to PCM storage chips can be generated by error-corrector 392.

PCM programming engine 397 can be a state machine that is activated on power-up reset. PCM programming engine 397 programs DMA engine 388 within the address of the boot loader code in the first page of the PCM storage chip, and the first address in RAM 386. Then PCM programming engine 397 commands DMA engine 388 to transfer the boot loader from the PCM storage chip to RAM 386. CPU 382 is then brought out of reset, executing the boot loader program starting from the first address in RAM 386. The boot loader program can contain instructions to move a larger control program from the PCM storage chip to RAM 386. Thus SATA PCM controller 300 is booted without an internal ROM on internal bus 396. SATA PCM controller 300 can be part of a solid-state mass-storage device that mimics behavior of a rotating hard disk drive.

FIG. 8 is a block diagram of a Secure-Digital/Multi-Media Card (SD/MMC) controller for a phase-change memory device. A removable storage card that interfaces to a host PC can be constructed from phase-change memory rather than from flash memory. The removable card can operate using the secure digital (SD) interface, or using the Multi-Media Card (MMC) interface.

The removable storage device can have an array of PCM memory chips that form one or more PCM mass-storage devices such as shown in FIG. 6. Each of the phase-change memory chips in the PCM mass-storage device can have the structure shown in FIGS. 3-4. These PCM memory chips communicate with single-chip PCM controller 160 over PCM bus 161. DMA engine 188 in PCM controller 190 writes and reads blocks of data in the array of PCM chips for the removable storage device.

Inside PCM controller 160, SD/MMC engine 181 is an interface to SD/MMC bus 164, which can connect to a southbridge controller chip, or another bus chip in a host computer. Internal bus 196 connects CPU 182 with RAM 186, FIFO data buffer 194, DMA engine 188, and PCM controller 190. CPU 182 executes instructions from RAM 186, while DMA engine 188 can be programmed to transfer data between FIFO data buffer 194 and PCM controller 190. CPU 182 can operate on or modify the data by reading the data over bus 196. RAM 186 can store instructions for execution by the CPU and data operated on by the CPU.

SD/MMC transceiver 184 connects to the clock CLK and data lines of SD/MMC bus 164 and contains both a clocked receiver and a transmitter. An interrupt to CPU 182 can be generated when a new command is detected on SD/MMC bus 134. CPU 182 can then execute a routine to handle the interrupt and process the new command.

SD/MMC operating registers 180 include the protocol registers required by the SD/MMC specification. Registers may include a data-port, write-protect, memory select, memory status, interrupt, and identifier registers. Other extension registers may also be present.

Command decode and validator 189 detects, decodes, and validates commands received over SD/MMC bus 134. Valid commands may alter bus-cycle sequencing by bus state machine 183, and may cause response generator 187 to generate a response, such as an acknowledgement or other reply.

The transmit and receive data from SD/MMC engine 181 is stored in FIFO data buffer 194, perhaps before or after passing through a data-port register in SD/MMC operating registers 180. Commands and addresses from the SD/MMC transactions can also be stored in FIFO data buffer 194, to be read by CPU 182 to determine what operation to perform.

Phase-change-memory PCM controller 190 includes one or more of PCM control registers 193, DMA engine 188, PCM programming engine 197, and error-corrector 192. Data can be arranged to match the bus width of internal bus 196 or PCM bus 161, such as in 12 or 128-bit words. DMA engine 188 can be programmed by CPU 182 to transfer a block of data between PCM bus 161 and FIFO data buffer 194.

PCM control registers 193 may be used in conjunction with DMA engine 188, or may operate independently. PCM-specific registers in PCM control registers 193 may include a data port register, interrupt, command and selection registers, address and block-length registers, and cycle registers. PCM control registers 193 include shadow registers that have a copy of the contents of registers in the PCM mass storage block, such as registers 25-31 of FIG. 6.

Error-corrector 192 can read parity or error-correction code (ECC) from PCM storage chips and perform data corrections. The parity or ECC bits for data that is being written to PCM storage chips can be generated by error-corrector 192. PCM programming engine 197 can be a state machine that is activated on power-up reset. PCM programming engine 197 programs DMA engine 188 within the address of the boot loader code in the first page of the PCM storage chip, and the first address in RAM 186. Then PCM programming engine 197 commands DMA engine 188 to transfer the boot loader from the PCM storage chip to RAM 186. CPU 182 is then brought out of reset, executing the boot loader program starting from the first address in RAM 186. The boot loader program can contain instructions to move a larger control program from the PCM storage chip to RAM 186. Thus SD/MMC PCM controller 160 is booted without an internal ROM on internal bus 196. SD/MMC PCM controller 160 can be part of a removable storage device that mimics behavior of a rotating hard disk drive.

FIG. 9 is a block diagram of a USB phase-change-memory (PCM) controller inside a USB PCM device. The USB PCM device can have an array of PCM memory chips that form one or more PCM mass-storage devices such as shown in FIG. 6.

Each of the phase-change memory chips in the PCM mass-storage device can have the structure shown in FIGS. 3-4. The USB PCM device with its PCM memory could replace flash memory 36 of FIG. 5 on the USB bus.

Internal bus 166 connects CPU 152 with RAM 156, serial-data buffer 164, DMA engine 158, and phase-change-memory controller 160. CPU 152 executes instructions from RAM 156, while DMA engine 158 can be programmed to transfer data between serial-data buffer 164 and phase-change-memory controller 160. CPU 152 can operate on or modify the data by reading the data over bus 166. RAM 156 can store instructions for execution by the CPU and data operated on by the CPU.

Serial transceiver 154 connects to the differential data lines D+, D− of USB bus 118 and contains both a differential receiver and a differential transmitter. Data is encoded or decoded using NRZI encoding. Bit stuffing can be used to align data. An interrupt to CPU 152 can be generated when a start-of-packet sequence is detected on USB bus 118. CPU 152 can then execute a routine to handle the interrupt and process the new packet.

Serial engine 150 can perform higher-level functions such as checking cyclical-redundancy-check (CRC) checksums, locating packet identifiers, end-of-packet markers, higher-level frame markers, and converting serial data to parallel data words. The transmit and receive data is stored in serial-data buffer 164. Commands and addresses from the USB packets can also be stored in serial-data buffer 164, but is read by CPU 152 to determine what operation to perform rather than being sent directly to phase-change-memory controller 160.

Phase-change-memory controller 160 includes PCM data buffer 168, which contains the commands, addresses, and data sent over PCM bus 108 to external phase-change-memory mass storage devices. Data can be arranged in PCM data buffer 168 to match the bus width of PCM bus 108, such as for 32 or 64-bit words. DMA engine 158 can be programmed by CPU 152 to transfer a block of data between PCM data buffer 168 and serial-data buffer 164.

Error-corrector 162 can read parity or error-correction code (ECC) from external phase-change-memory mass storage devices and perform data corrections. The parity or ECC bits for data in PCM data buffer 168 that are being written to the external phase-change mass storage devices can be generated by error-corrector 162.

PCM programming engine 167 can be a state machine that is activated on power-up reset. PCM programming engine 167 programs DMA engine 158 with the address of the boot loader code in the first page of the external PCM mass storage devices, and the first address in RAM 156. Then PCM programming engine 167 commands DMA engine 158 to transfer the boot loader from PCM data buffer 168 to RAM 156. CPU 152 is then brought out of reset, executing the boot loader program starting from the first address in RAM 156. The boot loader program can contain instructions to move a larger control program from the external PCM mass storage devices to RAM 156. Thus USB phase-change controller 130 is booted without an internal ROM on internal bus 166.

Figure 10:
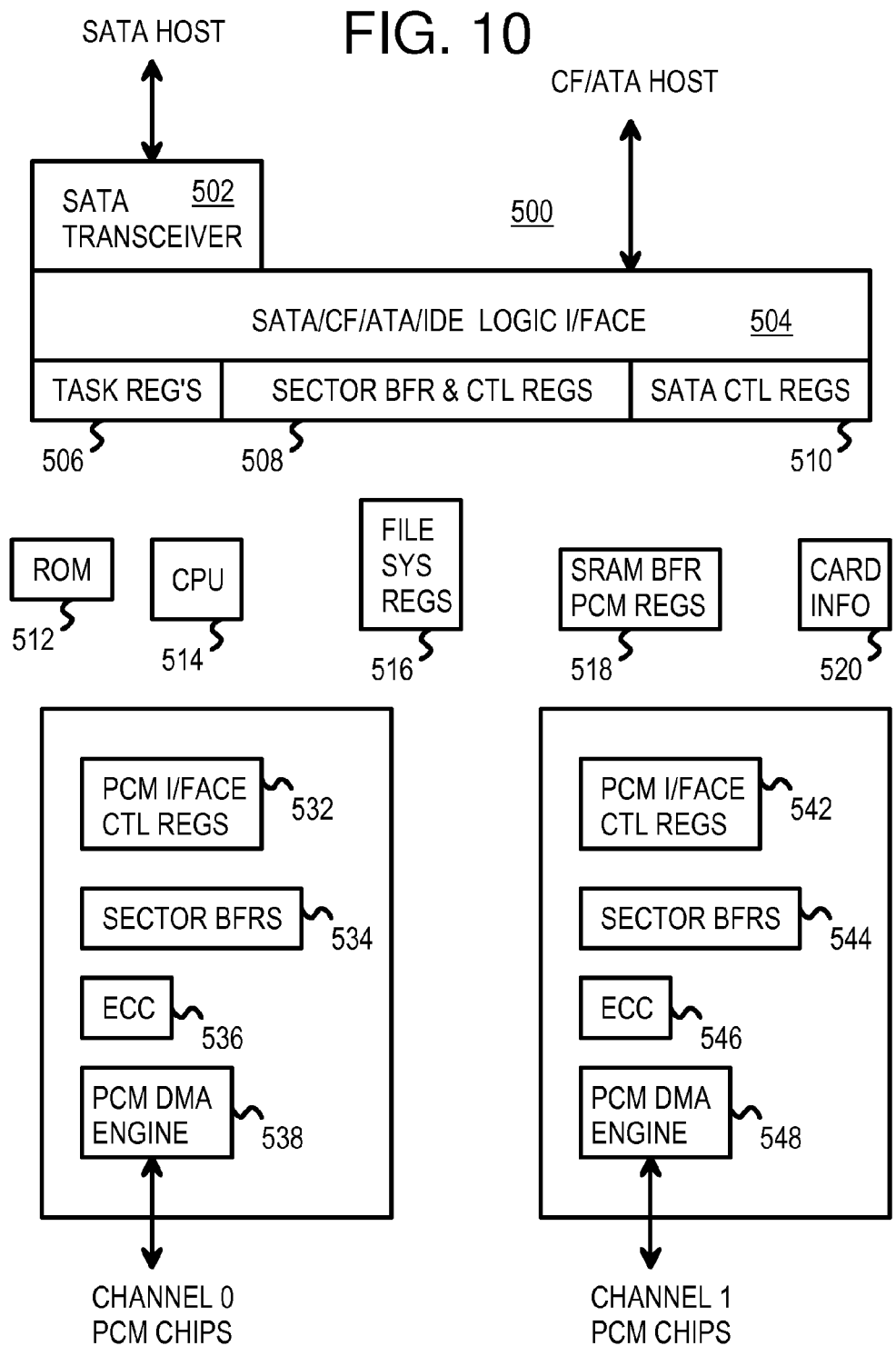
FIG. 10 shows a dual-channel PCM peripheral device.

FIG. 10 shows a dual-channel PCM peripheral device. The very long set pulse time for writing a 1 into the PCM memory cells can reduce performance when writing data into the PCM peripheral. Rather than arrange the phase-change memory chips into one block, two PCM blocks can be formed, each with its own data-transfer channel. Having dual channels to dual PCM blocks allows operations to be performed independently and concurrently on the two PCM blocks, improving performance.

When dual-channel peripheral device 500 connects to a SATA host, SATA transceiver 502 receives commands and write data from the SATA host, and sends back read data and status to the host by receiving and sending physical signals. When dual-channel peripheral device 500 connects to an ATA, IDE, or Compact Flash (CF) host, the host bus connects directly to interface 504. Interface 504 includes the physical signal interfaces and response-generation logic to respond to the host using a selected host-bus protocol. Interface 504 receives commands and write data from the host, and sends back read data and status to the host by receiving and sending physical signals.

The host may write and read a variety of protocol registers. Operations to be performed can be written into task registers 506, while sector data and control information can be written into sector buffer and control registers 508. SATA control registers 510 are used for SATA-specific control information.

The sector write data from sector buffer and control registers 508 can be transferred to either sector buffer 534, when channel 0 is being written, or to sector buffer 544 when channel 1 is being written. Control information from task registers 506 and/or sector buffer and control registers 508 are examined by central processing unit CPU 514, which reads and executes one or more routines in ROM 512 to perform the desired command from the host. PCM-specific commands and control information is written by CPU 514 into PCM interface control registers 532 when channel 0 is being accessed, or into PCM interface control registers 542 when channel 1 is being accessed. The choice of channels may be determined by decoding an address, or by CPU 514 using various criteria such as usage of the 2 channels and block re-mapping. File system registers 516 may be examined and updated to keep a catalog of files stored in phase-change memory chips in the 2 channels. Metadata, file names, read/write permissions and other file-specific information may also be maintained.

Once a channel is activated by CPU 514, such as by writing a start command to set a flag in PCM interface control registers 532, 542, the channel begins the data transfer. For a write to channel 0, data is read from sector buffer 534, error-correction code (ECC) is generated and attached to the data by ECC block 536, and PCM DMA engine 538 transfers the data to the external phase-change memory chips which generate the set and reset pulses to write the data into the PCM cells by melting or re-crystallizing the alloy resistors. A write to channel 1 is performed in a similar manner using sector buffer 544, ECC block 546, and PCM DMA engine 548.

For a read to channel 1, once CPU 514 initiates the transfer with a start command flag, PCM DMA engine 548 reads data from the phase-change memory chips, and ECC block 546 checks the data for errors using appended ECC bytes, which are stripped off the data. Error correction may also be performed using the ECC bytes. The corrected data is written into sector buffer 544, and the transfer status is updated in PCM interface control registers 542. Once the transfer is complete, CPU 514 transfers the read data from sector buffers 544 to sector buffer and control registers 508 for transfer to the host by interface 504.

SRAM buffer 518 may be used as an intermediate buffer for data and PCM-register information. Read and/or write data could be buffered by SRAM buffer 518, or only PCM register information. card information 520 contains card identifier and configuration information that the host can access. Dual-channel peripheral device 500 and its mass storage devices of phase-change memory chips could replace PCM solid-state disk 60 of FIG. 5.

Alternate Embodiments

Several other embodiments are contemplated by the inventors. Some of the block-level functions of the PCM mass storage device shown in FIG. 6 could be incorporated into the higher-level PCM controllers of FIGS. 7-9, or into the lower-level PCM chips of FIGS. 3-4. Rather than sending a whole block over to phase-change memory chips 96 using DMA, a series of words could be sent to phase-change memory chips 96 from the FIFO or other buffer on the controller chip. Various levels of address translation could be included, such as bad-block or wear-leveling re-mapping, or address caching for improving access speed. Rather than having one or two channels, four, eight, or more channels could be supported.

While a personal computer (PC) has been described, other kinds of computers could benefit from using PCM peripherals. For example, laptop, Apple Mac's, Linux, Unix, and other kinds of computers, and portable devices, such as an ultra-mobile personal computer, mobile Internet devices, personal digital assistants (PDAs), MP3 (or portable Media Player/MPEG-4), VoIP handsets, smart phones, cell phone handsets, gaming devices, and game consoles could be the computer that uses the invention. The PCM peripherals could be designed for backward compatibility with older legacy computers.

The PCM cells can use select transistors in series with the variable resistor as shown, or additional transistors may be added, such as for a dual-port memory with 2 bit lines per cell, and two select transistors that connect to the same alloy resistor. The melting and crystalline temperatures may vary with the alloy composition and with other factors such as impurities. The shape and size of the alloy resistor may also affect these temperatures and set, reset time periods.

The terms set and reset can be applied to either binary logic state. For example, set can refer to changing to the logic 1 state for positive logic, or to changing to the logic 0 state for negative or inverse logic. Likewise, reset is to 0 for positive logic, but inverted logic can reset to 1, such as for active-low logic. One system can use both active-high and active-low logic domains, and logic can refer to the physical states of the memory cells, or the data read at the I/O of a memory chip, or at some other point.

Directional terms such as upper, lower, up, down, top, bottom, etc. are relative and changeable as devices are rotated, flipped over, etc. These terms are useful for describing the device but are not intended to be absolutes. Some embodiments may have chips or other components mounted on only one side of a circuit board, while other embodiments may have components mounted on both sides.

Rather than use USB buses, other serial buses may be used such as PCI Express, ExpressCard, Firewire (IEEE 1394), serial ATA, serial attached small-computer system interface (SCSI), etc. When PCI Express is used, additional pins for the PCI Express interface can be added or substituted for the USB differential data pins. PCI express pins include a transmit differential pair PET+, PET−, and a receive differential pair PER+, PER− of data pins. A multi-bus-protocol chip could have an additional personality pin to select which serial-bus interface to use, or could have programmable registers. ExpressCard has both the USB and the PCI Express bus, so either or both buses could be present on an ExpressCard device.

The controller components such as the serial engine, DMA, PCM memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

A standard flash, DRAM, or SRAM controller may be integrated with the PCM controller to allow for accessing these various kinds of memories. Various routines may contain instructions that are part of the operating system, basic input-output system (BIOS), manufacturer-specific routines, and higher-level application programs, and various combinations thereof. Various modified bus architectures may be used. Buses such as the local bus may have several segments isolated by buffers or other chips.

The phase-change memory has been described as having cells that each store one binary bit of data. However, multi-level cells are contemplated wherein multiple logic levels are defined for different values of resistance of the alloy resistor.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A phase-change-memory peripheral comprising:
a peripheral phase-change-memory controller having a central processing unit (CPU) for executing instructions and a random-access memory (RAM) for storing instructions for execution by the CPU;
a bus transceiver in the peripheral phase-change-memory controller for receiving peripheral commands and data from a host over a host bus;
a phase-change-memory controller in the peripheral phase-change-memory controller;
a plurality of phase-change memory (PCM) cells organized as phase-change-memory mass storage devices, coupled to the phase-change-memory controller, for storing non-volatile data for the host, the data in the phase-change-memory mass storage devices being block-addressable and not randomly-addressable;
wherein each PCM cell in the plurality of PCM cells has a first logical state having an alloy in a crystalline phase and a second logical state having the alloy in an amorphous phase, wherein a resistance of the alloy is higher when in the amorphous phase than when in the crystalline phase;

a phase-change-memory bus having data lines for transferring data from the phase-change-memory controller to the phase-change-memory mass storage devices;

wherein instructions are stored only in the RAM for execution, wherein the CPU executes instructions stored only in the RAM;

wherein the instructions are transferred from a copy of the instructions in the phase-change-memory mass storage devices to the RAM during a power-on sequence before the CPU; and a direct-memory access (DMA) engine for transferring data among the phase-change-memory controller, the RAM, and the bus transceiver, the DMA engine being programmed for a transfer, whereby instructions are transferred from the phase-change-memory mass storage devices to the RAM for execution by the CPU and whereby the peripheral phase-change-memory controller controls the phase-change-memory mass storage devices that are block-addressable.

2. The phase-change-memory peripheral of claim 1 wherein a PCM cell in the plurality of PCM cells comprises:

a select transistor receiving a word line on a gate, and having a channel between a bit line and a cell node;

an alloy resistor formed from the alloy, coupled between the cell node and an array voltage;

wherein the PCM cell has the first logical state when the alloy resistor has the alloy in the crystalline phase, the alloy resistor having a low resistance that increases a sensing current from the bit line through the select transistor;

wherein the PCM cell has the second logical state when the alloy resistor has the alloy in the amorphous phase, the alloy resistor having a high resistance that reduces the sensing current from the bit line through the select transistor;

wherein the high resistance is larger than the low resistance;

whereby the sensing current is altered by the alloy being in the crystalline phase and the amorphous phase.

3. The phase-change-memory peripheral of claim 2 further comprising write drivers which comprise:

a set current generator, coupled to the bit line, for driving a set current through the select transistor and through the alloy resistor for a set period of time to write the PCM cell into the first logical state in response to set data bits in the data;

a reset current generator, coupled to the bit line, for driving a reset current through the select transistor and through the alloy resistor for a reset period of time to write the PCM cell into the second logical state in response to reset data bits in the data;

a reset timer for determining the reset period of time; and a set timer for determining the set period of time;

wherein the set period of time is at least double the reset period of time, whereby the PCM cell is set for a longer time period, and reset for a shorter time period.

4. The phase-change-memory peripheral of claim 3 wherein the reset current is at least twice the set current, and wherein the set current is at least twice the sensing current;

whereby the PCM cell is set by a lower current for a longer time period, and reset by a higher current and a shorter time period.

5. The phase-change-memory peripheral of claim 4 wherein the alloy is a chalcogenide glass layer having a melting point that is higher than a crystallization point.

6. The phase-change-memory peripheral of claim 5 wherein the alloy is an alloy of germanium (Ge), antimony (Sb), and tellurium (Te).

7. The phase-change-memory peripheral of claim 2 wherein a physical address is a partial address of a page of data in the phase-change-memory mass storage devices, the partial address having fewer address bits than a full word address that uniquely identifies a word of data in the phase-change-memory mass storage devices that can be transferred over the data lines in a single bus cycle.

8. The phase-change-memory peripheral of claim 2 further comprising:

an internal bus in the peripheral phase-change-memory controller, the internal bus connecting to the CPU, to the RAM, to a buffer for the bus transceiver, and to the phase-change-memory controller;

wherein the instructions executed by the CPU are transferred from the phase-change-memory mass storage devices over the phase-change-memory bus to the phase-change-memory controller and then to the internal bus for storage by the RAM.

9. The phase-change-memory peripheral of claim 2 wherein the bus transceiver connects to the host bus which is a Multi-Media Card/Secure Digital (MMC/SD) bus, an integrated device electronics (IDE) bus, an AT-Attachment (ATA) bus, a CompactFlash (CF) bus, a Memory Stick (MS) interface bus, a Serial AT-Attachment (SATA) bus, a Small Computer System Interface (SCSI) bus, a PCI-Express (PCIe) interface bus, or a Universal Serial Bus (USB) interface bus.

10. The phase-change-memory peripheral of claim 1 further comprising:

a phase-change-memory programming engine, coupled to the phase-change-memory controller, for programming the DMA engine to transfer instructions from a first page of the phase-change-memory mass storage devices to the RAM during an initial portion of the power-on sequence, whereby the first page of the phase-change memory mass storage devices is auto-loaded at power-on.

11. The phase-change-memory peripheral of claim 10 wherein the instructions transferred from the first page of the phase-change-memory mass storage devices comprise a boot loader program;

wherein the CPU is brought out of reset and begins executing instructions from the RAM once the boot loader program has been transferred to the RAM by the DMA engine;

wherein the CPU executes the boot loader program loaded into the RAM from the phase-change-memory mass storage devices.

12. A phase-change-memory drive comprising:

host interface means for connecting to a host over a host bus;

a phase-change-memory controller having a processor for executing instructions;

a main memory coupled to the processor for storing instructions for execution by the processor;

phase-change memory means for storing a data word as binary bits each represented by a chalcogenide glass layer having a melting point that is higher than a crystallization point, the chalcogenide glass layer forming a variable resistor that alters a sensing current when a binary bit is read;

wherein a crystalline state of the variable resistor represents a first binary logic state and an amorphous state of the variable resistor represents a second binary logic state for binary bits stored in the phase-change memory means;

phase-change-memory controller means for controlling access of the phase-change memory means;

address translation means for translating block addresses from the processor to access the phase-change memory means as data blocks having multiple data words; and direct-memory access (DMA) engine means for directly transferring data and instructions over an internal bus among the host interface, the main memory, the processor, and the phase-change-memory controller means, whereby data blocks are accessed in the phase-change memory means.

13. The phase-change-memory drive of claim 12 further comprising:

phase-change-memory programming engine means for initially programming the DMA engine means to read an initial program from a first page of the phase-change memory means and to write the initial program to the main memory for execution by the processor.

14. The phase-change-memory drive of claim 13 wherein the host interface comprises:

host transceiver means for receiving clocked data and commands from the host bus, and for driving data onto the host bus in response to a command;

host operating register means for storing data and commands in a format specified by a host protocol specification; and command decoder and validator means, coupled to the host operating register means, for decoding and validating a command received over the host bus by the host transceiver means.

15. The phase-change-memory drive of claim 14 wherein the host bus is a Multi-Media Card/Secure Digital (MMC/SD) bus, an integrated device electronics (IDE) bus, an AT-Attachment (ATA) bus, a CompactFlash (CF) bus, a Memory Stick (MS) interface bus, a Serial AT-Attachment (SATA) bus, a Small Computer System Interface (SCSI) bus, a PCI-Express (PCIe) interface bus, or a Universal Serial Bus (USB) interface bus.

16. The phase-change-memory drive of claim 14 wherein the phase-change memory means further comprises:

an alloy resistor in each memory cell in each array of memory cells, the alloy resistor storing binary data as solid phases each having a different resistivity;

wherein the alloy resistor changes from a crystalline state to an amorphous state when a memory cell is written from a logic 1 state to a logic 0 state in response to a reset current for a reset period of time;

wherein the alloy resistor changes from the amorphous state to the crystalline state when the memory cell is written from a logic 0 state to a logic 1 state in response to a set current for a set period of time;

wherein the amorphous state has a higher resistance than the crystalline state that is sensed by a sense amplifier.

17. The phase-change-memory drive of claim 16 wherein the phase-change-memory controller means further comprises:

a first channel for connecting to a first section of the phase-change memory means, the first channel comprising:

first PCM interface control registers for storing control information for controlling operation of the first section of the phase-change memory means;

first sector buffers for storing a first block of data for writing to the first section of the phase-change memory means;

first PCM DMA engine means for transferring the first block of data from the first sector buffers to the first section of the phase-change memory means;

a second channel for connecting to a second section of the phase-change memory means, the second channel comprising:

second PCM interface control registers for storing control information for controlling operation of the second section of the phase-change memory means;

second sector buffers for storing a second block of data for writing to the second section of the phase-change memory means; and second PCM DMA engine means for transferring the second block of data from the second sector buffers to the second section of the phase-change memory means, whereby the phase-change-memory controller means has multiple channels to access the phase-change memory means.

18. A phase-change-memory peripheral system comprising:

a clocked-data interface to a host bus that connects to a host;

a bus transceiver for detecting and processing commands sent over the host bus;

a buffer for storing data sent over the host bus;

an internal bus coupled to the buffer;

a random-access memory (RAM) for storing instructions for execution, the RAM on the internal bus;

a central processing unit, on the internal bus, the CPU accessing and executing instructions in the RAM;

a phase-change-memory controller, on the internal bus, for generating phase-change-memory-control signals and for buffering data to a phase-change-memory bus;

phase-change-memory mass storage devices coupled to the phase-change-memory controller by the phase-change-memory bus, and controlled by the phase-change-memory-control signals;

a direct-memory access (DMA) engine, on the internal bus, for transferring data over the internal bus;

wherein the phase-change-memory mass storage devices comprise an array of memory cells;

an alloy resistor in each memory cell in the array of memory cells, the alloy resistor storing binary data as solid phases each having a different resistivity;

wherein the alloy resistor changes from a crystalline state to an amorphous state when a memory cell is written from a logic 1 state to a logic 0 state in response to a reset current for a reset period of time;

wherein the alloy resistor changes from the amorphous state to the crystalline state when the memory cell is written from a logic 0 state to a logic 1 state in response to a set current for a set period of time;

wherein the amorphous state has a higher resistance than the crystalline state that is sensed by a sense amplifier; and a plurality of write drivers that apply the set current for the set period of time to memory cells being written by bits in the logic 1 state, and apply the reset current for the reset period of time to memory cells being written by bits in the logic 0 state, whereby data from the host is stored by the crystalline state and the amorphous state of the alloy resistor in each memory cell.

* * * * *